United States Patent [19]
Kamon

[11] Patent Number: 5,455,130
[45] Date of Patent: Oct. 3, 1995

[54] PHOTOMASK COMPRISING AN OPTICAL PATH ADJUSTING FILM

[75] Inventor: Kazuya Kamon, Itami, Japan

[73] Assignee: Mitsubishi Denki Kabushiki Kaisha, Tokyo, Japan

[21] Appl. No.: 181,448

[22] Filed: Jan. 14, 1994

Related U.S. Application Data

[63] Continuation of Ser. No. 717,068, Jun. 18, 1991, abandoned.

[30] Foreign Application Priority Data

Aug. 18, 1990 [JP] Japan ..................... 2-217612
Feb. 18, 1991 [JP] Japan ..................... 3-023094

[51] Int. Cl.⁶ ........................................ G03F 9/00
[52] U.S. Cl. ................. 430/5; 430/22; 430/311; 430/322; 430/396
[58] Field of Search ..................... 430/5, 22, 269, 430/311, 322, 396

[56] References Cited

U.S. PATENT DOCUMENTS 4,906,326  3/1990  Amemiya et al. .............. 430/5
5,045,417  9/1991  Okamoto ...................... 430/5
5,079,113  1/1992  Ohta et al. ................... 430/5

FOREIGN PATENT DOCUMENTS 105256    4/1989  Japan.
1-147458  6/1989  Japan.
3-203737  9/1991  Japan.

Primary Examiner—S. Rosasco
Attorney, Agent, or Firm—Oblon, Spivak, McClelland, Maier & Neustadt

[57] ABSTRACT

According to the inventive photomask, a light shielding pattern is formed at one major surface side of a transparent substrate, and an optical path adjusting film formed at one major surface side and/or the other major surface side of the transparent substrate for adjusting an optical path of light passing between adjacent regions of the light shielding pattern. Thus, the focal point of light passing between the adjacent regions of the light shielding pattern changes along the thickness direction of the resist film corresponding to the irregularity of the resist film, whereby the resist film can be accurately photosensitized in spite of the irregularity thereof.

9 Claims, 6 Drawing Sheets

PHOTOMASK COMPRISING AN OPTICAL PATH ADJUSTING FILM

This application is a continuation of application Ser. No. 07/718,068, filed on Jun. 18, 1991, now abandoned.

BACKGROUND OF THE INVENTION

1. Field of the Invention

The present invention relates to a photomask, which is employed for working a workpiece such as a semiconductor wafer through a lithographic technique.

2. Description of the Prior Art

FIG. 6 is a schematic block diagram of an exposure apparatus including a photomask which is generally used in a photolithographic process, and FIG. 7 is an enlarged view of its essential part.

As shown in these figures, light $L_1$ outgoing from a light source 1 is focused by a lens system 2 and emitted onto a photomask 3. In the photomask 3, a light shielding pattern 5 is formed on one major surface of a transparent substrate 4, so that light entering a region corresponding to the light shielding pattern 5 is cut off within light $L_2$ which is incident upon the photomask 3, while light entering the remaining region is transmitted. Light $L_3$ selectively transmitted through the photomask 3 is collected in a resist film 8 which is formed on a substrate 7 serving as a workpiece, through a projecting lens system 6 of a magnification m which is finished telecentrically, for example. Thus, the resist film 8 is partially photosensitized so that the mask pattern is transferred onto the resist film 8.

In the conventional photomask 3, however, the surface thereof is substantially formed into a plane, so that each light $L_3$ selectively transmitted through the photomask 3 forms an image on a focal plane 9 through the lens system 6. On the other hand, the surface of the substrate 7 serving as the workpiece is formed into an irregularity corresponding to an integrated circuit pattern formed on the substrate 7, so that the resist film 8 is also formed into an irregularity corresponding to the surface of the substrate 7. For example, when a convex region 7a shown in FIG. 7 is formed on the surface of the substrate 7, it produces a difference in level between the regions 8a and 8b of the resist film 8. In this case, when the focal point of the lens system 6 is adjusted on one region 8a, the other region 8b is out of the focal point thereof, while, when the focal point thereof is adjusted on the other region 8b, one region 8a is out of the focal point thereof, so that a defectively photosensitized region is inevitably caused in the resist film 8.

Continuing with the explanation more precisely, a prescribed depth of focus DOF expressed in the following equation is recognized in the lens system 6 with respect to light of a wavelength λ, assuming that NA represents its numerical aperture:

$$DOF \propto \frac{\lambda}{2 (NA)^2} \quad (1)$$

Since the resist film 8 is substantially photosensitized within the range of the aforementioned depth of focus DOF about the focal plane 9 along the thickness direction of the resist film 8, the aforementioned problem will not be caused if the value of the depth of focus DOF is sufficiently large with respect to the irregularity of the resist film 8.

With recent refinement of LSI, however, the numerical aperture NA tends to increase in consideration of the converging ability of the lens system 6. Consequently, the depth of focus DOF tends to decrease to the contrary. In a current manufacturing process for LSI, a lens system 6 having a numerical aperture NA of about 0.54 may be used for ultraviolet rays of 436 nm in wavelength λ, for example, and in this case, the depth of focus DOF is about 1.5 μm. On the other hand, the thickness of the resist film 8 is also about 1.5 μm, substantially equal to the depth of focus DOF. Therefore, the defectively photosensitized region is inevitably caused in the resist film 8, if the difference in level is formed in the resist film 8.

SUMMARY OF THE INVENTION

The present invention is directed to a photomask which is employed for transferring a prescribed pattern onto a resist film provided on a workpiece through a lithographic technique. The inventive photomask comprises a transparent substrate, a light shielding pattern formed at one major surface side of the transparent substrate, and an optical path adjusting film formed at one major surface side and/or the other major surface side of the transparent substrate for adjusting an optical path of light passing between adjacent regions of the light shielding pattern, thereby changing a focal point corresponding to the irregularity of the resist film.

Accordingly, an object of the present invention is to provide a photomask which can accurately photosensitize a resist film in spite of the irregularity thereof.

According to the inventive photomask, the optical path adjusting film is formed on the transparent substrate to change the focal point of the light passing between the adjacent regions of the light shielding pattern along the thickness direction of the resist film corresponding to the irregularity of the resist film, whereby the resist film can be accurately photosensitized in spite of the irregularity thereof.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
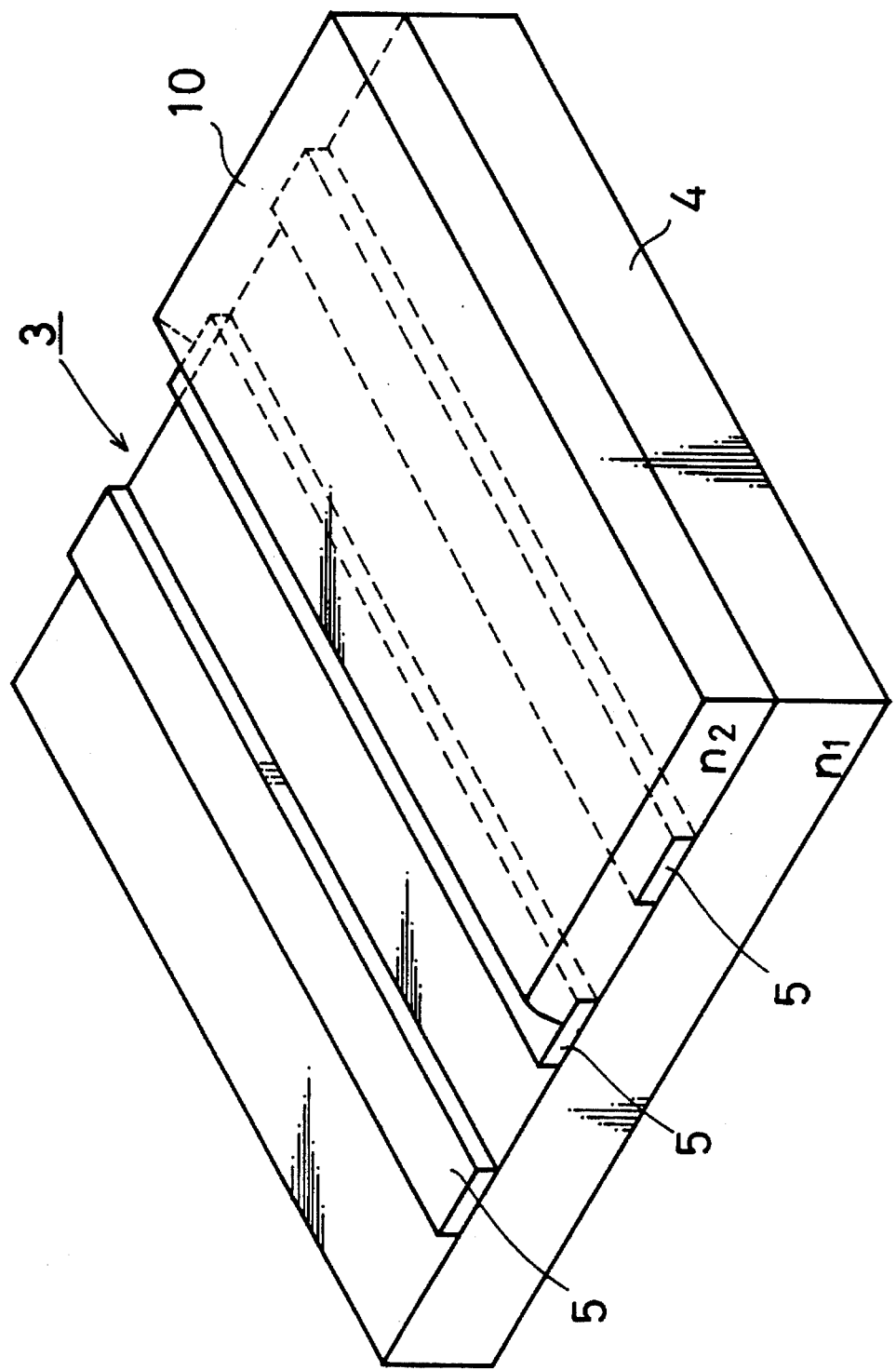
FIG. 1 is a perspective view of a photomask according to a first embodiment of the present invention.
Figure 2:
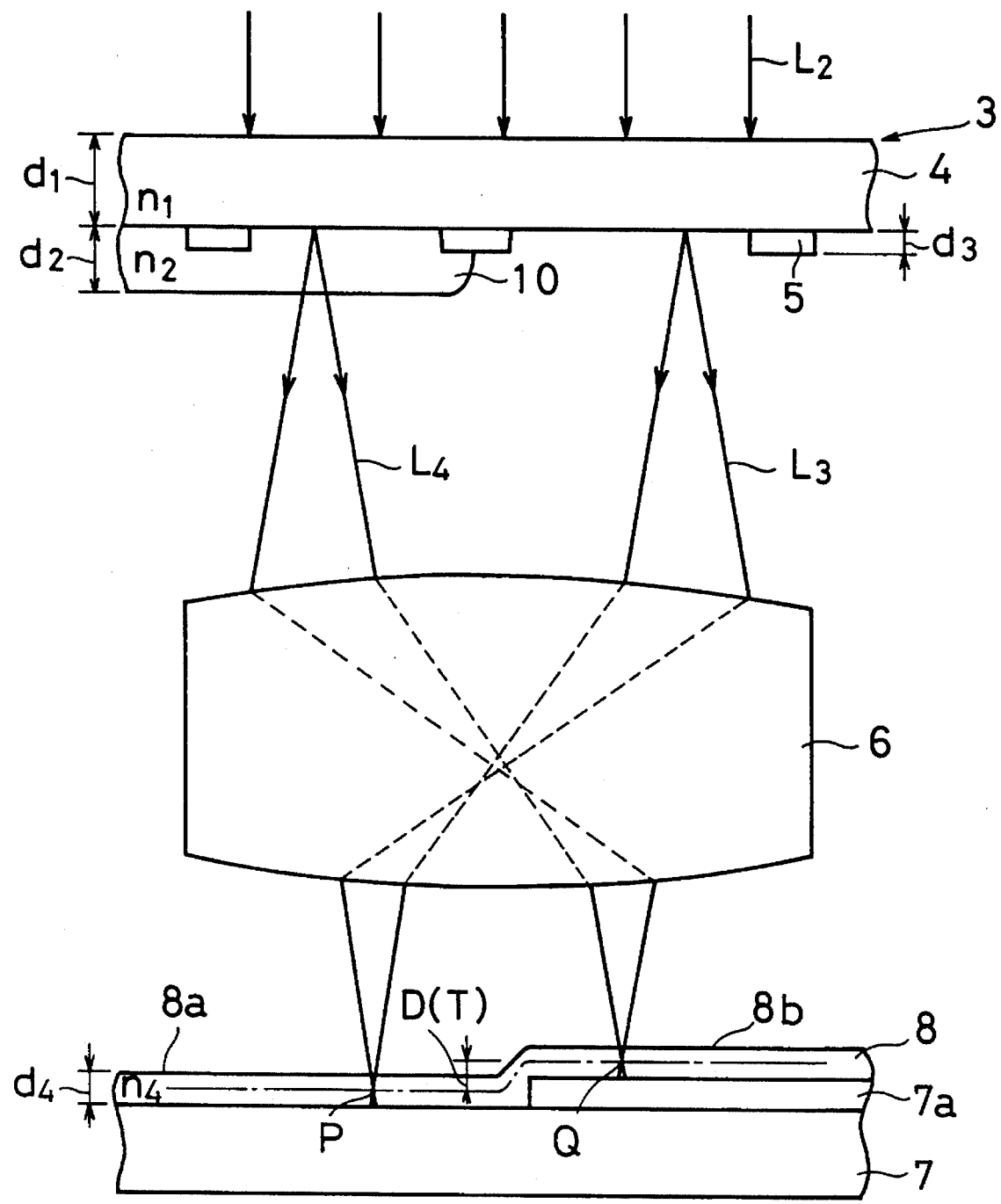
FIG. 2 is a block diagram showing an essential part of an exposure apparatus including the photomask of the first embodiment.
Figure 6:
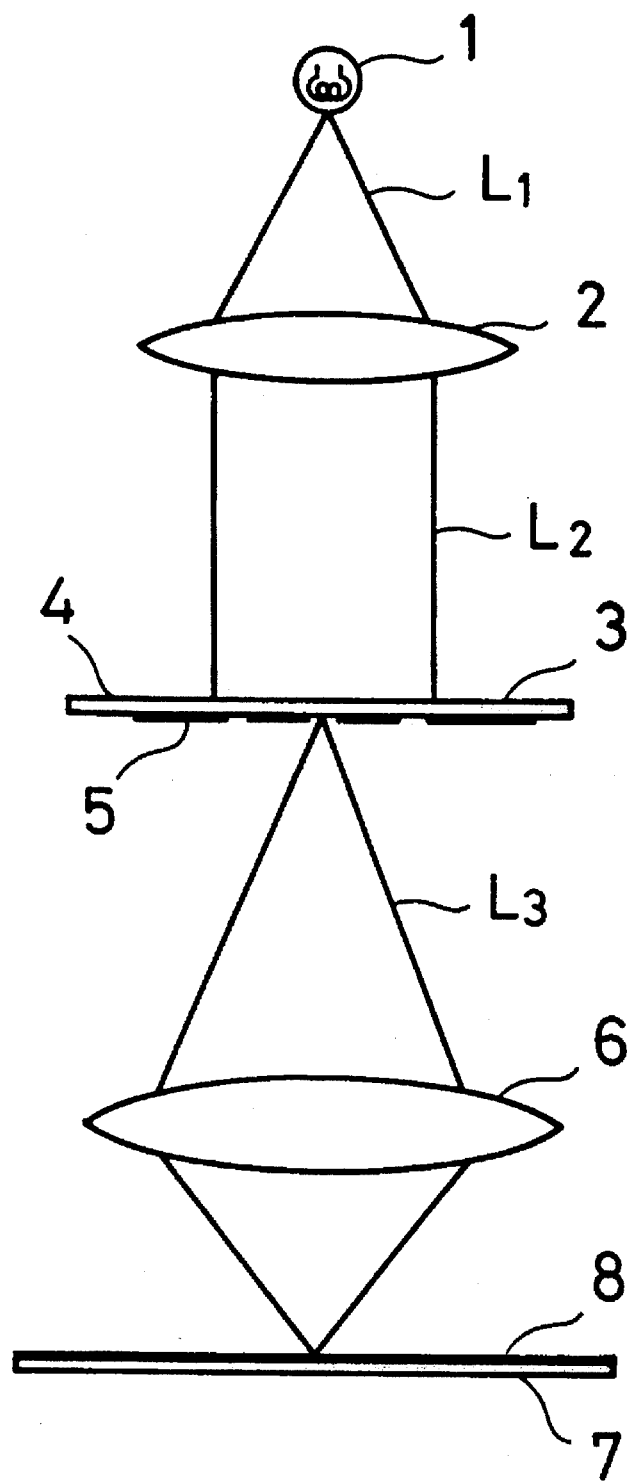
FIG. 6 is a schematic block diagram showing an exposure apparatus including a photomask generally employed in a photolithographic process.

FIG. 1 is a perspective view of a photomask according to a first embodiment of the present invention, and FIG. 2 is a block diagram showing an essential part of an exposure apparatus including the photomask. The components of this exposure apparatus are identical to those of the apparatus shown in FIG. 6, and hence the same or corresponding parts are indicated by the same reference numerals.

As shown in FIG. 1, a photomask 3 comprises a transparent substrate 4, a light shielding pattern 5 which is formed on one major surface of the transparent substrate 4, and an optical path adjusting film 10 which is formed on one major surface of the transparent substrate 4 to partially cover the light shielding pattern 5.

The transparent substrate 4 is formed of quartz, for example, and its refractive index $n_1$ is 1.47, while its thickness $d_1$ is about 5 mm.

The light shielding pattern 5 is formed of Cr, MoSi or the like, and its thickness $d_3$ is generally about 0.1 µm.

The optical path adjusting film 10 is formed of quartz ($SiO_2$), for example. This optical path adjusting film 10 is preferably formed of a material whose refractive index $n_2$ is completely or nearly equal to that $n_1$ of the transparent substrate 4. The reason is that, the more the difference between the refractive indices $n_1$ and $n_2$ decreases, the more the reflectivity at the boundary surface between the transparent substrate 4 and the optical path adjusting film 10 decreases, so that light emitted onto the photomask 3 can efficiently pass through the photomask 3 toward the lens system 6. In a case where the optical path adjusting film 10 is formed of quartz ($SiO_2$), its refractive index $n_2$ is 1.47 which is equal to that $n_1$ of the transparent substrate 4, whereby the reflectivity at the boundary surface therebetween is nearly zero. The position and the thickness $d_2$ of the optical path adjusting film 10 is decided in consideration of the irregularity of the resist film 8, as hereinafter described in detail.

A projecting lens system 6 is formed by a plurality of combination lenses, and telecentrically finished with respect to both directions of incidence and outgoing. The magnification m of this lens system 6 is set at ⅕, for example. However, the magnification m is not restricted to the above value, but may be ⅒ or 1, for example.

Figure 7:
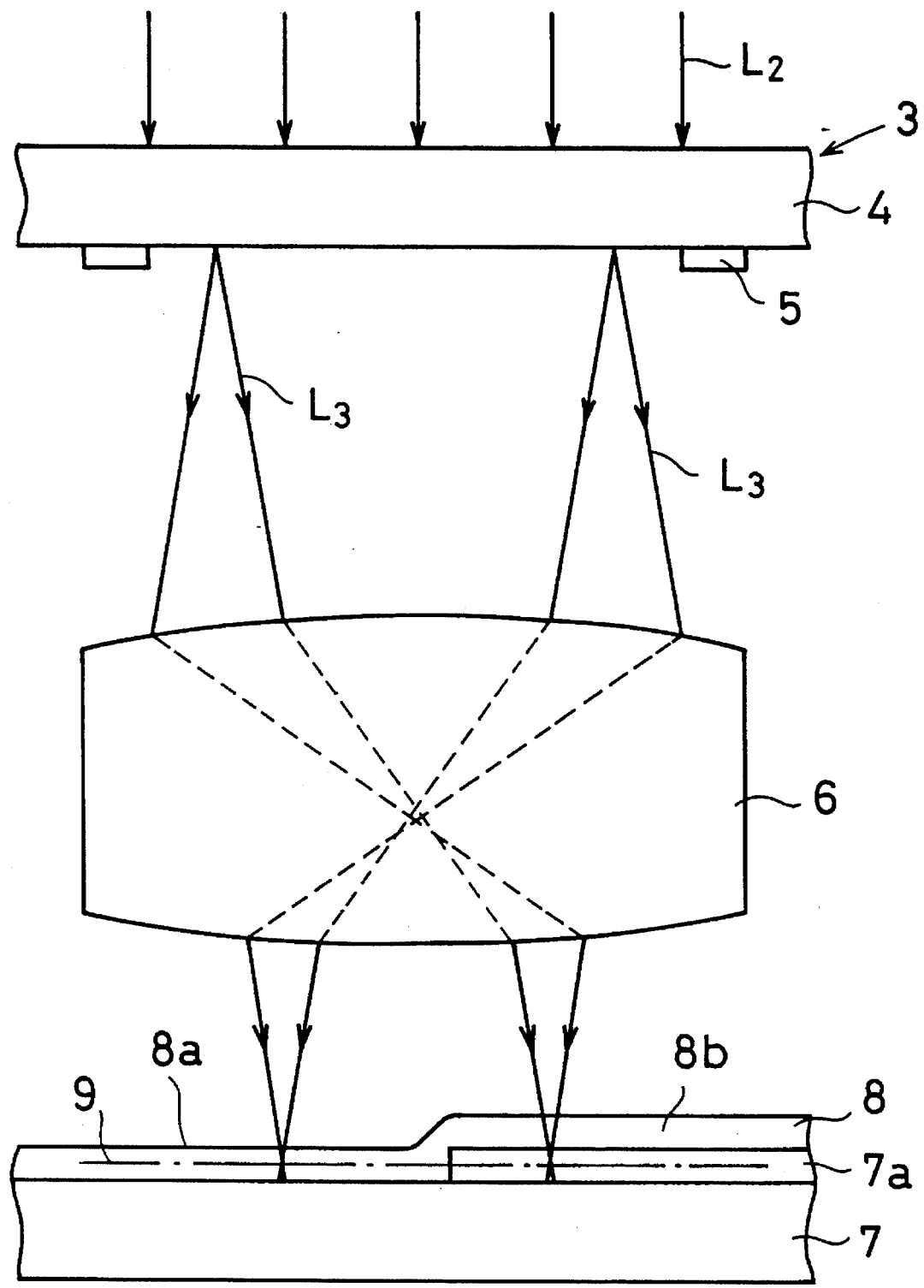
FIG. 7 is an enlarged view showing an essential part thereof.

A resist film 8 formed on a wafer substrate 7, which is a workplace, is prepared from a generally known resist material. When MCPR 2000H (made by Mitsubishi Kasei Kabushiki Kaisha) is employed, for example, its refractive index $n_4$ is 1.68 and its thickness $d_4$ is about 1.5 µm. For example, when the convex region 7a shown in FIG. 7 is formed on the surface of the substrate 7, the resist film 8 has the difference in level between the regions 8a and 8b.

In the exposure apparatus including this photomask 3, a light source 1 (see FIG. 6) emits ultraviolet light $L_1$ having a wavelength of 436 nm, for example, so that light $L_1$ is focused by the lens system 2 and emitted onto the photomask 3 as light $L_2$.

Part of the light $L_2$ emitted onto the photomask 3 is cut off by the light shielding pattern 5, while the remaining light passes between adjacent regions of the light shielding pattern 5 to be output toward the lens system 6. In this case, in a region which is not provided with the optical path adjusting film 10, transmitted light $L_3$ is directly output toward the lens system 6 from the transparent substrate 4, while in a region which is provided with the optical path adjusting film 10, transmitted light $L_4$ is output through the optical path adjusting film 10 toward the lens system 6.

The transmitted light $L_3$ and $L_4$ thus selectively transmitted through the photomask 3 are collected in a resist film 8 which is formed on the Si substrate 7 through the lens system 6, to form an image.

Now, since the refractive index $n_2$ of the optical path adjusting film 10 is larger than the refractive index 1 of air, the optical path of the transmitted light $L_4$ is longer than that of the transmitted light $L_3$ by $(n_2-1) d_2$. Consequently, the focal point Q with respect to the transmitted light $L_4$ of the lens system 6 gets nearer than the focal point P with respect to the transmitted light $L_3$ by a distance D along the direction of the optical axis of the lens system 6.

Now, the optical path $n_4D$ between the focal points P and Q is expressed, through optical path difference $(n_2-1) d_2$ between the transmitted light $L_3$ and $L_4$, and the magnification m of the lens system 6, as follows:

$$n_4D = m^2 \times (n_2-2) d_2$$

Hence, the shifting amount $\Delta F$ of a focal point is:

$$\Delta F = \frac{d_2}{R_2} \cdot \frac{n_2 - 1}{n_2} \tag{2}$$

where

R: the miniature rate of the lens system 6, $d_2$: the thickness of the optical path adjusting film 10, $n_2$: the refractive index of the optical path adjusting film 10.

As is apparent from the equation (2), the distance D depends on the thickness $d_2$ of the optical path adjusting film 10 when the values of the magnification m and the refractive indices $n_2$ and $n_4$ are fixed.

Therefore, if the thickness $d_2$ is fixed so as to be equal to the measurement T of the difference in level between the regions 8a and 8b of the resist film 8, in other words, if the thickness $d_2$ is fixed so as to satisfy the following equation:

$$d_2 = T \cdot R^2 \cdot \frac{n_2}{n_2 - 1} \tag{3}$$

it is possible to adjust the focal point P of the transmitted light $L_3$ on the region 8a, while adjusting the focal point Q of the transmitted light $L_4$ on the region 8b. When $n_2=1.47$, $n_4=1.68$ and m=⅕, for example, $d_2= 89.4T$.

According to the photomask 3, the optical path adjusting film 10 having the thickness $d_2$ corresponding to the irregularity of the resist film 8 is formed on the transparent substrate 4, so that the focal point of light passing between the adjacent regions of the light shielding pattern 5 changes corresponding to the irregularity of the resist film 8, whereby the resist film 8 can be accurately photosensitized in spite of the irregularity thereof.

In addition, the optical path adjusting film 10 is formed of quartz ($SiO_s$) as well as the transmitted substrate 4, so that the refractive index $n_2$ of the optical path adjusting film 10 is completely or nearly equal to that $n_1$ of the transparent substrate 4. As a result, the refractivity at the boundary surface between the transparent substrate 4 and the optical path adjusting film 10 is nearly zero, whereby the light $L_2$ emitted onto the photomask 3 is scarcely reflected at the boundary surface and is efficiently emitted onto the resist film 8.

In the above embodiment, although the resist film 8 has one difference in level, it may have a plurality of differences in level, or the difference in level thereof may change continuously. In that case, the thickness $d_2$ of the optical path adjusting film 10 may be fixed so as to change in a plurality of steps or continuously, corresponding to the irregularity of the resist film 8.

Figure 3:
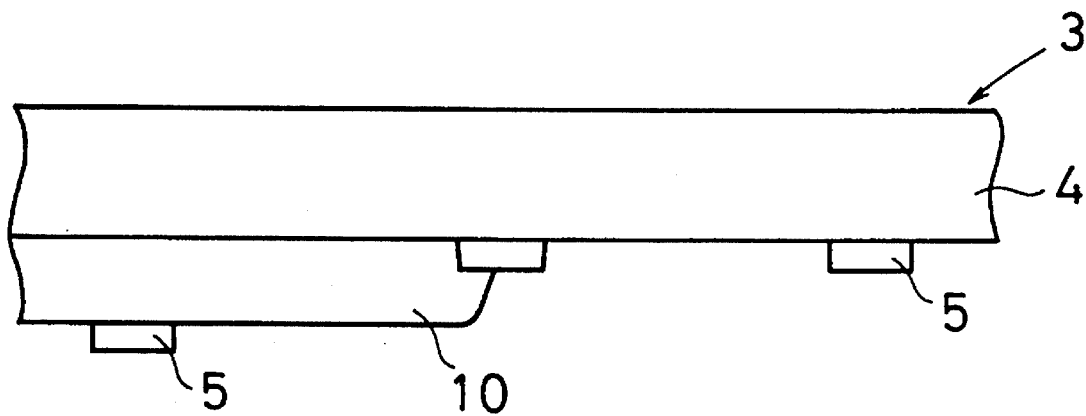
FIGS. 3 to 5 are diagrams showing modifications of the photomask according to the first embodiment respectively.
Figure 4:
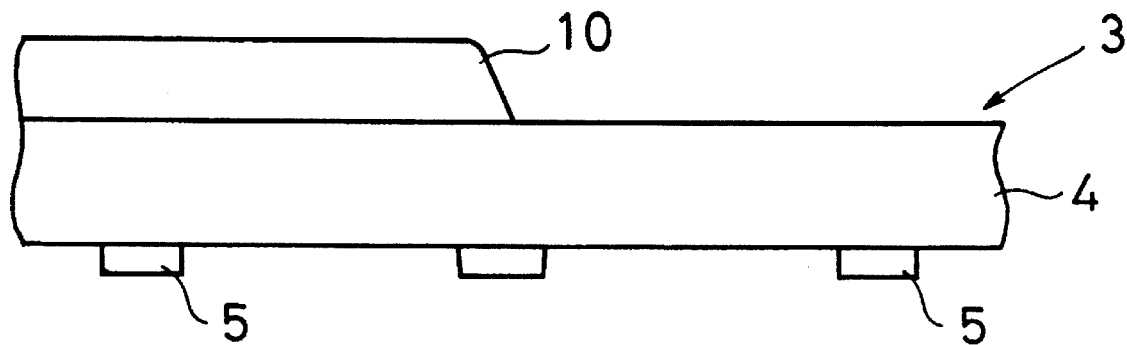
Figure 5:
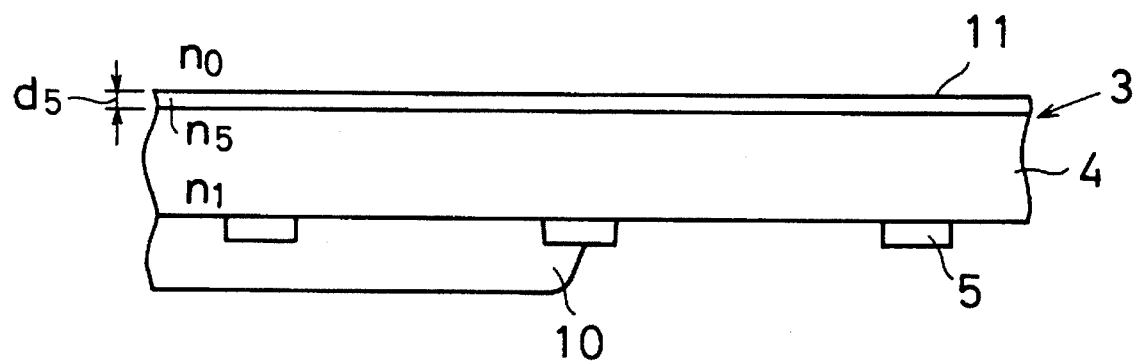

FIGS. 3 to 5 illustrate modifications of the aforementioned photomask 3 respectively.

A photomask 3 shown in FIG. 3 forms a light shielding pattern 5 on an optical path adjusting film 10, not on a transparent substrate 4, in a region which is provided with the optical path adjusting film 10. Other structures are identical to the photomask 3 shown in FIG. 2, and the same effect as in the photomask 3 of FIG. 2 can be achieved.

In the photomask having the structure shown in FIG. 3, the shifting amount ΔF of a focal point is expressed by the following expression:

$$\Delta F = \frac{d_2}{R^2} \cdot \frac{1}{n_2} \quad (4)$$

Accordingly, the thickness $d_2$ of the optical path adjusting film 10 is obtained by substituting the size T of the irregularity D of the resist film 8 for the shifting amount ΔF of a focal point in the above expressions (2) and (3).

In the photomask shown in FIG. 3, the thickness $d_2$ is expressed as follows:

$$d_2 = T \cdot R^2 \cdot n_2 \quad (5)$$

In a photomask 3 shown in FIG. 4, an optical path adjusting film 10 is formed on the other major surface of a transparent substrate 4, not on one major surface thereof. Other structures are identical to the photomask 3 shown in FIG. 2, and the same effect as in the photomask 3 of the FIG. 2 can be achieved. The optical path adjusting film 10, however, may be formed on both the major surfaces of the transparent substrate 4.

A photomask 3 shown in FIG. 5 further comprises an antireflection film 11 on the other major surface of the transparent substrate 4. The antireflection film 11 is formed of $MgF_2$, for example, and its refractive index $n_5$ is 1.378. Refractive indices $n_O$, $n_5$ and $n_1$ of the air layer, the antireflection film 11 and the transparent substrate 4 are in relations of $n_o < n_5 < n_1$, and hence an excellent antireflection effect can be attained by setting the thickness $d_5$ of the antireflection film 11, for example, as follows:

$$d_5 = \frac{\lambda}{4n_5}$$

If this antireflection film 11 is not provided, part of the light incident upon the photomask 3 from a light source 1 is reflected by the upper surface of the transparent substrate 4 to become stray light, or part of the incident light reflected by the lower surface of the transparent substrate 4 is again reflected by the upper surface of the transparent substrate 4 to become stray light and is output toward a lens system 6. The antireflection film 11 prevents generation of such stray light, thereby improving exposure accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask employed for transferring a prescribed pattern through a lens system onto a resist film having an irregularity provided on a workpiece by a lithographic technique, said photomask comprising:

a transparent substrate;

a light shielding pattern formed on one major surface of said transparent substrate; and an optical path adjusting film formed on one major surface of said transparent substrate to partially cover said light shielding pattern for adjusting an optical path of light passing between adjacent regions of said light shielding pattern, thereby changing a focal point corresponding to the irregularity of said resist film, to uniformly photosensitize the resist film over its entire extent including the irregularity;

the following conditions being satisfied, where $d_2$ represents a thickness of said optical path adjusting film, $n_2$ represents a refractive index of said optical path adjusting film, m represents a magnification of said lens system, R represents a miniature rate of said lens system, and T represents a size of irregularity of said resist film;

$$d_2 = \frac{T}{m^2} \cdot \frac{n_2}{n_2 - 1} = T \cdot R^2 \cdot \frac{n_2}{n_2 - 1}$$

2. A photomask in accordance with claim 1, wherein said optical path adjusting film is formed of a material whose refractive index is equal to that of said transparent substrate.

3. A photomask employed for transferring a prescribed pattern through a lens system onto a resist film provided on a workpiece by a lithographic technique, said photomask comprising:

a transparent substrate;

an optical path adjusting film selectively formed on one major surface of said transparent substrate for changing a focal point corresponding to the irregularity of said resist film, to uniformly photosensitize the resist film over its entire extent including the irregularity; and a light shielding pattern formed on one major surface of said transparent substrate;

the following conditions being satisfied, where $d_2$ represents a thickness of said optical path adjusting film, $n_2$ represents a refractive index of said optical path adjusting film, m represents a magnification of said lens system, R represents a miniature rate of said lens system, and T represents a size of irregularity of said resist film;

$$d_2 = \frac{T}{m^2} \cdot n_2 = T \cdot R^2 \cdot n_2$$

4. A photomask in accordance with claim 3, wherein said optical path adjusting film is formed of material whose refractive index is equal to that of said transparent substrate.

5. A photomask employed for transferring a prescribed pattern through a lens system onto a resist film having an irregularity provided on a workpiece by a lithographic technique, said photomask comprising:

a transparent substrate;

a light shielding pattern formed on one major surface of said transparent substrate; and an optical path adjusting film selectively formed on one major surface of said transparent substrate, to uniformly photosensitize the resist film over its entire extent including the irregularity.

6. A photomask in accordance with claim 5, wherein the light shielding pattern and optical path adjusting film are formed on the same major surface of said transparent substrate.

7. A photomask in accordance with claim 5, wherein the light shielding pattern and optical path adjusting film are formed on opposite major surfaces of said transparent substrate.

8. A photomask in accordance with claim 7, wherein radiation for photosensitizing the resist film impinges on the major surface of said transparent substrate on which the optical path adjusting film is formed.

9. A photomask in accordance with claim 5, wherein the optical path adjusting film and transparent substrate are formed of materials with a same refractive index.

* * * * *